United States Patent [19]
Marabella

[11] Patent Number: 4,608,330
[45] Date of Patent: Aug. 26, 1986

[54] METHOD FOR PRODUCING MICROCAPSULES AND PHOTOSENSITIVE MICROCAPSULES PRODUCED THEREBY

[75] Inventor: Charles P. Marabella, Woodbury, Minn.

[73] Assignee: The Mead Corporation, Dayton, Ohio

[21] Appl. No.: 716,793

[22] Filed: Mar. 27, 1985

Related U.S. Application Data

[63] Continuation-in-part of Ser. No. 533,087, Sep. 19, 1983, abandoned.

[51] Int. Cl.$^4$ .......................... G03C 1/00; G03C 1/40; G03C 1/72; B01J 13/02
[52] U.S. Cl. ................................. 430/138; 428/402.2; 428/402.22; 430/56; 430/58; 430/901
[58] Field of Search ................... 430/58, 56, 901, 138; 428/402.2, 402.22

[56] References Cited

U.S. PATENT DOCUMENTS

| | | | |
|---|---|---|---|
| 3,687,865 | 8/1972 | Katayama | 252/316 |
| 4,273,672 | 1/1981 | Vassiliades | 252/316 |
| 4,399,209 | 8/1983 | Sanders et al. | 430/138 |
| 4,416,966 | 11/1983 | Sanders et al. | 430/138 |

*Primary Examiner*—John E. Kittle
*Assistant Examiner*—Mukund J. Shah
*Attorney, Agent, or Firm*—Biebel, French & Nauman

[57] ABSTRACT

A method for forming microcapsules by enwrapping an oily core material in a formaldehyde condensation product formed in situ wherein methylated polygalacturonic acid is used as an emulsion stabilizer; the method is particularly useful in forming photosensitive microcapsules in that uniform small microcapsule size is obtained.

22 Claims, No Drawings

METHOD FOR PRODUCING MICROCAPSULES AND PHOTOSENSITIVE MICROCAPSULES PRODUCED THEREBY

CROSS REFERENCE TO RELATED APPLICATION

This application is a continuation-in-part of U.S. Application Ser. No. 533,087, filed Sept. 19, 1983, now abandoned.

BACKGROUND OF THE INVENTION

The present invention relates to an improved method for producing microcapsules and, more particularly, to an improved method for producing microcapsules in which the wall is formed from a formaldehyde condensation product. While the method of the present invention is useful in producing microcapsules generally, microcapsules prepared in accordance with the present invention are particularly useful in photosensitive imaging materials of the type which employ a layer of microcapsules containing a radiation sensitive composition.

Imaging materials employing photosensitive microcapsules are the subject of commonly assigned U.S. Pat. Nos. 4,399,209 and 4,440,836. Imaging materials employing other types of photoactive microcapsules are the subject of the following U.S. patents.

Berman, U.S. Pat. No. 3,219,446 discloses a transfer imaging process in which a blue-black dye is encapsulated with a photocrosslinkable polymer or a photopolymerizable monomer in a film or a layer of discrete microcapsules. In this system imaging is accomplished by image-wise exposing the layer of the encapsulated material to electromagnetic radiation to crosslink the polymer or polymerize the monomer. This is said to cause the liquid in the exposed capsules to assume a non-liquid, rigid condition, such that upon rupturing the capsules only the dye from the unexposed capsules is transferred to a receiving sheet where images are formed.

Phillips, U.S. Pat. No. 3,700,439, discloses a process wherein Michler's ketone is encapsulated in a conventional manner and provided as a layer on a support. Michler's ketone is not a color former, but irradiation of the ketone converts it to a colorless, acid colorable, dye precursor. Thus, by image-wise exposing the Phillips material to actinic radiation and rupturing the capsules in contact with an acid developer layer, such as a layer of acid clay, a visible image is obtained in the areas in which the ketone has been converted to the acid colorable form by irradiation. Phillips also discloses a self-contained system in which the acid developer is on the same support as the capsules containing the Michler's ketone.

Levy, U.S. Pat. No. 4,149,887, relates to a capsule-containing imaging material having a photoconductive internal phase which is exposed in an RF field. Exposure increases the conductivity of the internal phase and causes the capsules to heat, swell and then rupture in the exposed areas thereby freeing the contents to form images. The capsules may contain color precursors which form images by reacting with a developing agent.

Japanese Kokai, 6212/1974 to Matsushita Denki Sangyo K.K., relates to a recording material in which microcapsules having a photocrosslinkable polymer wall contain a colorless or substantially colorless precursor in a polar solvent and, optionally, an acid dye developer. The polar solvent prevents the color precursor from reacting with the acid dye developer and forming a color image. Images are formed by image-wise exposing the material to actinic radiation and rupturing the capsules in the unexposed areas, whereupon the polar solvent evaporates and color development occurs.

Japanese Kokai, 9519 and 9520/1978 to K.K. Rikoh, relate to imaging systems in which the capsules contain a radiation curable internal phase including a dye precursor. Images are formed by image-wise exposing a layer of the capsules to light and selectively transferring the capsules from the unexposed areas to a receiving sheet. The capsules are not ruptured. Upon subsequent wet development processing of the transfer sheet with a dye developer, the dye precursor in the capsules is converted to a colored form and an image is obtained.

British Pat. Nos. 1,001,832; 1,058,798; 1,141,475; and 1,193,923 to DuPont relate to imaging materials which employ a photopolymerizable substratum comprising a solid binder having a polymerizable ethylenically unsaturated compound dispersed therein. Images are formed by image-wise exposing the materials to actinic radiation. Exposure controls the rate of diffusion of a developer into or out of the photopolymerizable substratum. In the case of British Pat. No. 1,058,798, a dye or color precursor is present in the capsules and images are formed by bringing a receiving sheet, such as plain or coated paper, into contact with a substratum and heating the two in combination such that the dye diffuses from the unexposed areas of the substratum to the receiving sheet. In the case of British Pat. No. 1,141,475, at least one of a color former, developer and oxidizing agent is present in the dispersed phase and the substratum is hardened in the exposed areas thereby altering the rate of diffusion of an externally applied reactant into the substratum.

In the aforesaid commonly assigned U.S. patents, images are formed by image-wise exposing a layer of photosensitive capsules to actinic radiation and rupturing the capsules typically by passing the imaging sheet containing the capsules through a pressure nip. The radiation sensitive composition contains a photohardenable or photosoftenable material which undergoes a change in viscosity upon exposure. For example, in the most typical embodiments, the radiation sensitive composition contains a polyethylenically unsaturated monomer which polymerizes upon exposure, thereby causing the phase internal to the capsules to become harder. Due to the difference in the hardness of the capsules in the exposed versus the unexposed areas, only certain capsules rupture and release their contents. If the internal phase contains a dye precursor, the precursor is image-wise released, and a color image is formed upon its transfer to a developer layer. In previously disclosed embodiments, the developer layer may be present on the same support as the layer of capsules or a separate support. It is advantageous if the developer is present on the same support since such a self-contained imaging sheet can be developed as an integral unit.

One of the problems associated with self-contained imaging sheets is that smudging and pinpoints occur as the sheet is handled, packaged or stacked for storage. This is due to the capsules inadvertently rupturing and releasing the dye precursor which reacts with the developer present on the sheet. The problem intensifies if the capsules are too large and can be eliminated or substantially lessened if the capsules are reduced in size. However, previously it has only been possible to obtain capsules having the desired uniform small size using a certain dye precursor. This is not an acceptable solution to the problem, because it is often necessary to use other dye precursors in the capsules to form images of other colors or to improve the color tone.

Thus, there is a need for an improved method for producing microcapsules of uniform small particle size which are particularly useful in providing a self-contained imaging sheet.

SUMMARY OF THE INVENTION

The present invention relates to a method for producing microcapsules and, more particularly, to a method of producing photosensitive microcapsules.

In the present invention, microcapsules are prepared by emulsifying an oily material in an aqueous medium containing pectin or another methylated polygalacturonic acid. It has been found that when pectin is dissolved in the aqueous medium, and the capsule wall is formed in an otherwise conventional manner, microcapsules of uniform small size are obtained. When these microcapsules are used in forming photosensitive imaging sheets as described in the aforementioned commonly assigned patents, an increase in photographic gamma is often available.

Photosensitive microcapsules obtained in accordance with the present invention are characterized by an average particle size in the range of about 4 to 8 microns. At least 90% of the microcapsules have a particle size less than 10 microns. Because of their uniform small size these microcapsules are particularly useful in forming self-contained imaging sheets where the presence of larger capsules often results in inadvertent, premature development in the form of smudging or background coloring.

Accordingly, one embodiment of the present invention is a process for producing microcapsules comprising enwrapping particles of an oily core material dispersed in a continuous aqueous phase in polymeric shells produced by in situ condensation of formaldehyde and an amine wherein the aqueous phase contains methylated polygalacturonic acid as an emulsion stabilizer.

The principal example of the emulsion stabilizer used in the present invention is pectin, but other methylated polygalacturonic acids can also be used.

Another embodiment of the present invention resides in microcapsules having a discrete capsule wall and containing, in the internal phase, a radiation sensitive composition, said microcapsules being produced by enwrapping particles of an oil-in-water emulsion containing methylated polygalacturonic acid as an emulsion stabilizer in a polymer produced by in situ polmerization of formaldehyde and an amine, said microcapsules having an average particle size of about 4 to 8 microns, and not less than about 90% of said capsules being less than 10 microns in size.

Still another embodiment of the present invention is an imaging sheet. Self-contained imaging sheets in accordance with the present invention comprise a support, a layer of the aforesaid microcapsules, and a color developer layer preferably interposed between the layer of capsules and the support. Transfer sheets generally consist of a layer of the microcapsules on a support. Transfer sheets are exposed separately and then assembled with a sheet containing a dye developer on the surface for development.

The capsules may contain a photohardenable or a photosoftenable material, as the radiation sensitive material. In the most typical case, the capsules contain a polyethylenically unsaturated monomer, a photoinitiator, and a dye precursor. Imaging is conducted as described in the aforemention commonly assigned patent and application which are incorporated herein by reference.

DETAILED DESCRIPTION OF THE INVENTION

The term "methylation degree" as used herein refers to the ratio of acid groups in the compound which are methylated to the total number of acid groups in the compound expressed as a percentage.

In accordance with the present invention, microcapsules are prepared from an aqueous based emulsion of an oily core material containing methylated polygalacturonic acid in the aqueous phase. Methylated polygalacturonic acids are generally available having a methylation degree in the range of about 50 to 75%. The preferred polygalacturonic acids have a methylation degree in excess of about 50% and more preferably about 60 to 75%. However, acids having a methylation degree less than 50% and greater than 75% are also believed to be useful. The most typical examples of useful acids are commonly known as pectins. Polygalacturonic acid is generally added to the aqueous phase in an amount of about 1.0 to 8% based on the amount of water in the external phase, with the preferred amount being about 2 to 4%.

Emulsification is preferably conducted under conditions which afford an emulsion having an average particle size in the range of about 8 to 12 microns. The observed particle size of the emulsion is somewhat larger than the particle size of the capsules produced. Typically, the emulsion is prepared by adding an oily material to be encapsulated to an aqueous phase containing methylated polygalacturonic acid while stirring or otherwise agitating the aqueous phase to achieve the desired emulsion particle size. The aqueous phase may also include other capsule wall forming materials in a manner well known in the art.

The capsule wall can be formed around the radiation-sensitive oil droplets in the emulsion using many known wall forming techniques.

The present invention is particularly directed to forming microcapsules in which the oily core material is enwrapped in a formaldehyde condensation product. Such microcapsules are formed by in situ condensation of formaldehyde and an amine such as urea, melamine, dimethylol urea, and the like. The condensation product can be modified by the co-condensation of a polyhydric phenol such as resorcinol if desired. Microcapsules can be prepared by forming an aqueous phase containing pectin, and adjusting the pH to about 4.0, followed by the addition of the oil phase, both phases being previously heated to about 60° C. Blending is continued until an average emulsion particle size of about 10 microns has been achieved whereupon solutions of the amine and formaldehyde are added to the emulsion and the capsule walls gradually form.

Among many well known encapsulation techniques that can be used in the present invention are: Hart et al, U.S. Pat. No. 3,755,190 for resorcinol-formaldehyde capsules; Vassiliades, U.S. Pat. No. 3,914,511 for isocyanate capsules; Kiritani et al, U.S. Pat. No. 3,796,669 for urea-resorcinol-formaldehyde capsules; Forris et al, U.S. Pat. Nos. 4,001,140; 4,087,376 and 4,089,802 for melamine-formaldehyde capsules. The present invention can be practiced using the aforesaid techniques by incorporating pectin in the aqueous phase prior to emulsification of the oil.

The process of the invention typically involves forming an agitating aqueous solution having the core material dispersed therein and, while maintaining the dispersion, adding solutions of the amine and formaldehyde thereto. On reaction, a formaldehyde condensate separates from the solution which wets and enwraps the capsule core material. After the walls have been solidified, the capsules may be separated from the medium and washed.

One method in accordance with the present invention involves the following steps:
(i) preparing an aqueous solution of pectin and a systems modifier,
(ii) emulsifying the core material therein,
(iii) adding urea to the system,
(iv) adding formaldehyde to the system,
(v) adding the acid catalyst,
(vi) polymerizing the urea and formaldehyde while stirring the system,
(vii) heating, and
(viii) reacting the excess formaldehyde.

The process is flexible. Urea can be added in step (i), (iv), (v) or (vi). The system modifier could be added in steps (iii), (iv) or (v), and the acid catalyst can be added in step (i), (iii) or (iv).

Another process involves the following sequence of steps:
(i) emulsifying an oil in an aqueous acid solution containing pectin,
(ii) adding an aqueous solution of urea,
(iii) adding an aqueous solution of resorcinol,
(iv) adding an aqueous solution of formaldehyde,
(v) heating to 65° C.,
(vi) adjusting the pH to 9.0,
(vii) adding a solution of sodium acid sulfite to scavenge excess formaldehyde, and
(viii) removing an aqueous dispersion of the microcapsules.

The condensation reaction proceeds under acid conditions, e.g., pH of 7.0 or less; however, the reaction is preferably carried out at a pH in the range of 2.5 to 5.0. The temperature of the encapsulation medium should be maintained at about 10° to 95° C., preferably about 25° to 85° C. and more preferably about 45° to 75° C.

Among the acid catalysts that may be used are low molecular weight carboxylic acids, e.g., formic acid, acetic acid, etc.; inorganic acids, e.g., sulfuric acid, hydrochloric acid, phosphoric acid, etc.; and acidic or easily hydrolyzable salts such as aluminum sulfate, ammonium nitrate, ammonium chloride, ammonium sulfate, etc. Ammonium salts are preferred as they seem to provide a stronger and less permeable capsule. The ammonium salts are usually employed in an amount of about 2 to 20% by weight based on the amount of urea.

The amine and formaldehyde are preferably present in the encapsulation medium, whether as the free monomer or a precondensate, in a molar ratio of formaldehyde to amine of at least 1.5 and preferably about 2.0 to 3.0.

To reduce malodor and the incidence of skin irritation, when the polymerization reaction is complete, it is desirable to remove or react the excess formaldehyde. This can be accomplished by using any one of several known techniques such as the addition of phosphoric acid, urea, sulfite or bisulfite. These materials react with the formaldehyde to form a product which is easily removed from the medium. The addition of the urea or sodium sulfite to scavenge formaldehyde is preferably made in a single step after encapsulation and prior to storage. The pH and temperature of the medium should be adjusted for this reaction. The sulfite is preferably reacted at a pH of 6 to 8 at room temperature for about 2 hours. The urea can be reacted at a pH of 3 to 5 or 8 to 12 at a temperature of 30° to 60° C. for 4 hours.

Suitable polyhydric phenols that may be added to the reaction system for co-condensation with the amine and formaldehyde to improve permeability are resorcinol, catechol, gallic acid, and the like. The phenols may be added in an amount of about 5 to 30% by weight based on the amount of urea.

In most cases it is desirable to add a polyisocyanate to the core material. This practice is described in detail in U.S. Pat. No. 4,353,809. The polyisocyanate is believed to react with water at the interface of the core material and the aqueous medium and form a thin layer of polymer which further stabilizes the emulsion. Preferred polyisocyanates are SF-50, an aromatic triisocyanate manufactured by Union Carbide and N-100, a biuret of hexamethylene diisocyanate and water manufactured by Mobay Chemical Co. The isocyanate is typically added in an amount of about 0.005 to 3 parts per 100 parts of the core material and preferably 0.01 to 2 parts.

Other protective colloids or systems modifiers can be used in preparing the microcapsules, in combination with pectin or another methylated polygalacturonic acid, to achieve improved properties. For example, some anionic colloids such as maleic anhydride copolymer can be used as modifiers in encapsulation processes in which ureaformaldehyde, melamine-formaldehye or the like is used as the wall former. It is particularly advantageous to use isobutylene-maleic anhydride copolymer (e.g., Isobam No. 10) in combination with pectin.

The process of the present invention is advantageously used to produce microcapsules for use in photographic or pressure-sensitive recording papers. In the former embodiment, the core material is typically a substantially colorless color former dissolved in an oil. In the latter embodiment, the core material is typically a photosensitive composition containing a color former.

The radiation-sensitive compositions used in the present invention undergo a change in viscosity upon exposure to actinic radiation. "Actinic radiation" includes the entire electromagnetic spectrum (e.g., U.V., I.R., Visible), X-ray and ion beam radiation. These compositions may be positive working or negative working. For example, where the radiation sensitive composition contains a photohardenable material, such as, a photopolymerizable or photocrosslinkable material, in the exposed areas the internal phase solidifies or increases in viscosity and thereby prevents the capsules from rupturing and releasing the image forming agent (e.g., a color precursor) associated with the capsules. In the unexposed areas, the internal phase remains liquid, the capsules rupture, and the image-forming agents are mobilized. In this manner positive images are formed. On the other hand, where the capsules contain a photosoftenable material, such as a photodepolymerizable material, exposure reduces the viscosity of the internal phase and the elements active in the image-forming process are released in the exposed areas whereby negative images are formed.

Typical positive-working radiation sensitive compositions include a photoinitiator and a monomer, dimer, or oligomer which is polymerized to a higher molecular weight compound, or a polymer which is cross-linked upon exposure. Ethylenically unsaturated organic compounds are particularly useful. These compounds contain at least one terminal ethylene group per molecule. Typically, they are liquid and can double as a diluent oil for the internal phase. Ethylenically unsaturated compounds having two or more terminal ethylene groups per molecule are preferred. An example of this preferred subgroup are ethylenically unsaturated acid esters of polyhydric alcohols, such as trimethylol propane triacrylate (TMPTA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from the Richardson Company, Melrose Park, Ill.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including isocyanate modified esters and reactive diluents are commercially available as over print varnishes from Sun Chemical Corp., Carlstat, N.J., under the tradename of Sun Cure resins.

An example of negative working radiation depolymerizable materials that may be useful in the invention are 3-oximino-2-butanone methacrylate which undergoes main chain scission upon U.V. exposure and poly 4'-alkyl acylophenones. See Reichmanis, E.; *Am. Chem. Soc. Div. Org. Coat. Plast. Chem. Prepr.* 1980. 43, 243–251 and Lukac, I.; Chmela S., Int. Conf. on Modif. Polym. 5th. Bratislave, Czech. July 3–6, 1979, I.U.P.-A.C. Oxford, England 1979, 176–182.

A photoinitiator is generally also required in the radiation sensitive composition. Numerous examples of suitable imaging initiators can be found in the literature. Examples of photoinitiators useful in the present invention include diaryl ketone derivatives, and benzoin alkyl ethers. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy-2-phenylacetophenone,isopropylxanthone and ethyl paradimethylamino-benzoate. The later is preferably used with TMPTA to provide a radiation sensitive composition.

The amount of photoinitiator in the radiation sensitive composition depends on the particular photosensitive material selected. It must be present in an amount sufficient to initiate polymerization or crosslinking within a short exposure time.

The radiation sensitive composition must make up a large enough proportion of the internal phase to effectively control the release of the image-forming agent following exposure. This generally means that the radiation sensitive material must constitute approximately 40 to 99% by weight of the internal phase of the capsules.

In the most typical case, color images are formed by image-wise releasing a color precursor from the capsules. In this case, in addition to the radiation sensitive composition, the internal phase usually includes the color precursor. Typical examples of color precursors useful in the present invention in providing photosensitive or pressure-sensitive systems include colorless electron donating type compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem IV and XI (all products of Hilton-Davis Co.) are often used alone or in combination as color precursors in the present invention. Numerous other examples can be found in the carbonless paper art.

Color precursors represent only one type of image-forming agent which may be incorporated in or otherwise associated with the capsules of the present invention. Depending on the nature of the imaging material, other image-forming agents including colored dyes, pigments, metal salts and chelating agents may be incorporated into the capsules. The image-forming agent can be incorporated in a separate layer of the imaging sheet instead of in the capsules and activated by the release of the internal phase from the capsules. For example, the released internal phase may act as a solvent for an image-forming agent otherwise associated with the capsules.

Useful color developer materials for preparing the self-contained sheets of the present invention are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. These compounds are generally referred to as electron accepting type compounds.

Any ordinary coating or printing technique may be used to make the pressure-sensitive or photosensitive sheets of the present invention. The techniques described in U.S. Pat. No. 4,010,292 are useful.

The substrate upon which the capsules are coated may be paper (e.g., commercial impact raw stock, cast-coated paper, chrome-rolled paper, etc.), foil, or a plastic substrate (e.g., a PET film). High quality papers are preferred because, due to the small size of the capsules of the present invention, they can become embedded in the stock fibers and prevented from rupturing upon exposure and development.

In addition to a radiation-sensitive composition and a color precursor, the internal phase may also include a diluent oil to adjust the tonal properties of the imaging sheet (i.e., the transfer sheet or the selfcontained sheet). Representative examples of useful diluent oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls are generally less toxic and preferred.

Imaging sheets incorporating the photosensitive capsules of the present invention are used by image-wise exposing them to actinic radiation and rupturing the capsules. As explained in the aforementioned commonly assigned patents, it is likely that images are formed by a combination of mechanisms whereby more capsules rupture in the exposed or unexposed areas depending upon whether the imaging material is a positive working or a negative working material, and the capsules which rupture release their contents in proportion to the degree of exposure. Reference may be made to U.S. Pat. No. 4,399,209 to Sanders et al for a discussion of imaging mechanics. The capsules are usually ruptured by pressure (e.g., by passing the exposed sheet through pressure rolls), but may also be ruptured by other means such as solvent vapor, ultrasound, abrasion, and the like.

The present invention is illustrated in more detail by the following non-limiting examples.

EXAMPLE 1

1. Preparation of Isobam-10 Solution:

To 30 gallons of water under agitation is slowly added 44 lbs. of Isobam-10 powder. Upon sufficient dispersion, 16 lbs. of sodium hydroxide (powder) is slowly added, and the resultant suspension is heated at 93° C. for 2 hours. The final solution is brought to room temperature (20% solids).

2. Preparation of Continuous Phase:

A vessel equipped with a speed controllable mixer is charged with 90.0 g of the aforementioned hydrolyzed Isobam-10 aqueous solution, 235.0 g of a 5.3% aqueous solution of pectin and 200.0 g water. The pH is then adjusted to 4.0.

3. Preparation of Internal Phase:

To 200.0 g trimethylolpropanetriacrylate is added, with mild heating, 12.0 g Copikem IV, 48.0 g Irgacure 651, 4.0 g Quanticure ITX, and 4.0 g Quanticure EPD. The resulting solution is cooled and slowly added to the continuous phase with sufficient agitation to yield oil droplets in the range of 10 microns.

4. Capsule Preparation:

33.2 g urea in 50 ml water, 3.2 g resorcinol in 25 ml water, 85.6 g of 37% aqueous formaldehyde, and 2.4 g ammonium sulfate in 25 ml water are added to the emulsion obtained in step 3 above. The temperature of the combined mixture is raised to 65° C. and held for 2 hours. Upon discontinuing heating, the pH of the slurry is adjusted to 9.0, sodium bisulfite (11.2 g in 25 ml water) is added, and after 0.5 hour, agitation is discontinued. This preparation consistently yields microcapsules with an average diameter in the range of 4 to 8 microns and not less than 96% of the microcapsules are less than 10 microns in size.

COMPARISON EXAMPLE

Example 1 above was repeated except the aqueous pectin solution was replaced with 10% gum arabic solution (123.0 g) in the continuous phase. This preparation did not yield microcapsule populations with an average diameter less than 15.0 microns, and the distribution ranged from submicron to 100 microns in size.

Having described the invention in detail and by reference to specific embodiments thereof, it will apparent that numerous modifications and variations are possible without departing from the scope of the invention defined by the following claims.

I claim:

1. A process for forming microcapsules having discrete capsule walls comprising the steps of forming an emulsion of an oily core material in a continuous aqueous phase containing methylated polygalacturonic acid as an emulsion stabilizer, and enwrapping particles of said oily core material in a formaldehyde condensation product produced by in situ condensation of an amine and formaldehyde.

2. The process of claim 1 wherein said amine is urea or melamine.

3. The process of claim 2 wherein said polygalacturonic acid is pectin.

4. The process of claim 3 wherein said continuous phase additionally includes an anionic colloid.

5. The process of claim 4 wherein said formaldehyde condensation product is a melamine-formaldehyde resin.

6. The process of claim 4 wherein said formaldehyde condensation product is a urea-formaldehyde resin.

7. The process of claim 4 wherein said anionic colloid is isbutylene-maleic anhydride copolymer.

8. An imaging sheet comprising a support carrying on one surface thereof a layer of microcapsules having discrete capsule walls, said microcapsules containing a radiation sensitive material in the internal phase and being formed by enwrapping particles of an oil-in-water emulsion containing methylated polygalacturonic acid as an emulsion stabilizer in a formaldehyde condensation product produced by in situ polymerization of formaldehyde and an amine, and said capsules being further characterized by an average particle size of about 4 to 8 microns and not less than 90% of said capsules having a particle size less than 10 microns.

9. The imaging sheet of claim 8 wherein said sheet comprises a layer containing a color developer material.

10. The imaging sheet of claim 8 wherein said condensation product is a urea-formaldehyde resin.

11. The imaging sheet of claim 8 wherein said condensation product is a melamine-formaldehyde resin.

12. The imaging sheet of claim 8 wherein said radiation sensitive material includes a polyethylenically unsaturated compound and a photoinitiator.

13. The imaging sheet of claim 8 wherein said polygalacturonic acid is pectin.

14. The process of claim 1 wherein said process is further characterized in that the average particle size of said microcapsules is about 4 to 8 microns and at least 90% of said microcapsules are less than or equal to 10 microns.

15. The process of claim 14 wherein said oily core material comprises a radiation sensitive composition.

16. The process of claim 1 wherein said methylated polygalacturonic acid has a methylation degree of about 50 to 75%.

17. The process of claim 16 wherein said continuous phase contains approximately 1.0 to 8% by weight pectin.

18. The imaging sheet of claim 8 wherein said continuous phase additionally includes an anionic colloid.

19. The imaging sheet of claim 18 wherein said anionic colloid is isobutylene maleic anhydride copolymer.

20. The imaging sheet of claim 8 wherein said methylated polygalacturonic acid is characterized by a methylation degree of about 50 to 75% and said methylated polygalacturonic acid is present in said continuous phase in an amount of approximately 1.0 to 8%.

21. The process of claim 1 wherein said oily core material is enwrapped in a wall-forming material which consist essentially of said formaldehyde condensation product.

22. The imaging sheet of claim 8 wherein said oily core material is enwrapped in a wall-forming material which consist essentially of said formaldehyde condensation procuct.

* * * * *